United States Patent
Gotkis et al.

(10) Patent No.: US 7,010,468 B2
(45) Date of Patent: *Mar. 7, 2006

(54) METHOD AND APPARATUS FOR SLOPE TO THRESHOLD CONVERSION FOR PROCESS STATE MONITORING AND ENDPOINT DETECTION

(75) Inventors: Yehiel Gotkis, Fremont, CA (US); Vladimir Katz, Fremont, CA (US); David Hemker, San Jose, CA (US); Rodney Kistler, Los Gatos, CA (US); Nicolas J. Bright, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/030,374

(22) Filed: Jan. 5, 2005

(65) Prior Publication Data

US 2005/0125202 A1 Jun. 9, 2005

Related U.S. Application Data

(63) Continuation of application No. 10/318,967, filed on Dec. 13, 2002, now Pat. No. 6,859,765.

(51) Int. Cl.
*H04B 15/00* (2006.01)
(52) U.S. Cl. ...................... 702/193; 382/141
(58) Field of Classification Search ............ 702/22, 702/58, 66, 71, 73, 104, 111, 116, 119, 182–184, 702/191–193; 451/5, 6, 8; 382/141, 149; 438/14

See application file for complete search history.

(56) References Cited

U.S. PATENT DOCUMENTS

| | | | | |
|---|---|---|---|---|
| 4,809,196 A | * | 2/1989 | Miller | 436/4 |
| 5,444,637 A | * | 8/1995 | Smesny et al. | 702/127 |
| 6,049,220 A | * | 4/2000 | Borden et al. | 324/765 |
| 6,538,723 B1 | * | 3/2003 | Hagiwara et al. | 355/67 |
| 6,780,657 B1 | * | 8/2004 | Ino et al. | 438/14 |
| 6,859,765 B1 | * | 2/2005 | Gotkis et al. | 702/193 |

* cited by examiner

*Primary Examiner*—Marc S. Hoff
*Assistant Examiner*—Mohamed Charioui
(74) *Attorney, Agent, or Firm*—Martine Penilla & Gencarella, LLP

(57) ABSTRACT

A method for converting a slope based detection task to a threshold based detection task is provided. The method initiates with defining an approximation equation for a set of points corresponding to values of a process being monitored. Then, an expected value at a current point of the process being monitored is predicted. Next, a difference between a measured value at the current point of the process being monitored and the corresponding expected value is calculated. Then, the difference is monitored for successive points to detect a deviation value between the measured value and the expected value. Next, a transition point for the process being monitored is identified based on the detection of the deviation value. A processing system configured to provide real time data for a slope based transition and a computer readable media are also provided.

23 Claims, 12 Drawing Sheets

METHOD AND APPARATUS FOR SLOPE TO THRESHOLD CONVERSION FOR PROCESS STATE MONITORING AND ENDPOINT DETECTION

CROSS REFERENCE TO RELATED APPLICATIONS

This application is a continuation application of U.S. patent application Ser. No. 10/318,967, filed on Dec. 13, 2002 now U.S. Pat. No. 6,859,765, and entitled "METHOD AND APPARATUS FOR SLOPE TO THRESHOLD CONVERSION FOR PROCESS STATE MONITORING AND ENDPOINT DETECTION," which is herein incorporated by reference in its entirety for all purposes.

BACKGROUND OF THE INVENTION

1. Field of the Invention

This invention relates generally to semiconductor manufacturing and more particularly to real time metrology for process and wafer state monitoring in semiconductor manufacturing operations.

2. Description of the Related Art

During semiconductor fabrication, there exists multiple steps where an underlying substrate is subjected to the formation, modification and removal of various layers, blanket or patterned. The small feature sizes, tight surface planarity requirements, combined with the constant quest to increase throughput, makes it highly desirable to stop or change the process parameters when the targeted properties (thickness, resistance, planarity, transparency, chemical composition etc.) of the processed film has been achieved, i.e., when an endpoint has been obtained for the current process step. Of course, some semiconductor fabrication steps transition to a subsequent fabrication step after the current process step has accomplished the task of obtaining the defined wafer characteristics.

Real time metrology for the control of wafer characteristics is now a necessity so that an endpoint or transition point for a particular processing operation may be determined. The real time in-situ monitoring of parameters associated with a semiconductor operation provides valuable information as to an endpoint or a transition point of a processing operation. Typically the properties of an object, either the wafer itself or another object, which is strongly linked to the wafer in the process, undergo monotonic change prior to and after the transition, experiencing an abrupt property variation during the transition itself. This leads to a step-like property for monitoring signal variation in cases when the monitored system is small enough and when the transition occurs simultaneously for the watch point of the inspection space. For larger systems, such as semiconductor wafers, there is a time distribution, which transfers a step-like transition point into a slope change, associated with data points corresponding to the process parameter changes, thereby creating an indicator of the endpoint or transition point. However, slope change detection requires usage of derivatives, which are associated with reduced signal-to-noise ratio complicating this approach.

FIG. 1 is a graph of a thickness of a semiconductor wafer being monitored over time during a processing operation, such as a planarization processing operation. Line 100 represents values associated with an infrared (IR) based sensor for determining an endpoint/transition point during a processing operation. Lines 102 represent values associated with a plurality of eddy current sensors (ECS) for capturing thickness of a semiconductor wafer over time during the processing. As can be seen, region 104 represents the time where the endpoint/transition point occurs. In region 104, the general slope associated with lines 102 and line 100 transition. However, the signal being monitored for either the IR monitoring or eddy current monitoring is superimposed with significant and variable background noise that changes from run to run. Accordingly, when measuring the derivative based slope to determine the endpoint, the signal to noise level affects the stability and reliability of the endpoint determination. Thus, in-line determination of a transition point predicated upon a slope based analysis does not provide the robust data necessary for semiconductor operations.

As a result, there is a need to solve the problems of the prior art to provide a method and apparatus for providing stable and reliable transition point determination for processes where the transition point occurs through a slope based transition of a monitored process parameter.

SUMMARY OF THE INVENTION

Broadly speaking, the present invention fills these needs by eliminating the need to analyze derivative based data and enabling determination of the transition point through a threshold analysis in order to improve the reliability and stability of the determination of a transition point. It should be appreciated that the present invention can be implemented in numerous ways, including as a method, a system, computer readable media or a device. Several inventive embodiments of the present invention are described below.

In one embodiment, a method for converting a slope based detection task to a threshold based detection task is provided. The method initiates with defining an approximation equation for a set of points corresponding to values of a process being monitored. Then, an expected value at a current point of the process being monitored is predicted. Next, a difference between a measured value at the current point of the process being monitored and the corresponding expected value is calculated. Then, the difference is monitored for successive points to detect a deviation value between the measured value and the expected value. Next, a transition point for the process being monitored is identified based on the detection of the deviation value.

In another embodiment, a method for detecting a transition point of a slope based change through a threshold detection is provided. The method initiates with monitoring a parameter associated with a transition point. Then, a predicted value of the parameter is calculated from past values of the monitored process parameter. The predicted value corresponds to a current value of the process parameter being monitored. Next, a threshold value is defined. Then, a difference between the current value and the predicted value is tracked. Next, when the difference exceeds the threshold value a transition point is identified.

In yet another embodiment, a semiconductor processing system capable of detecting a transition point for slope change transitions through a threshold determination in real time is provided. The system includes a processing module configured to process a semiconductor wafer until a defined parameter associated with the semiconductor wafer being processed is obtained. The processing system includes a sensor configured to monitor a process parameter associated with a process operation. The system includes a detector in communication with the sensor. The detector is configured to compare measured values to predicted values, where the measured values indicate a transition point through a slope change. The predicted values are derived from previously measured values. The detector is further configured to track a difference between the measured values and the corresponding predicted values to enhance a change at the transition point to enable a threshold deviation value to be defined. The threshold deviation value indicates the transition point associated with the process operation.

In still yet another embodiment, a computer readable media having program instructions for converting a slope based detection task to a threshold based detection task is provided. The computer readable media includes program instructions for defining an approximation equation for a set of points corresponding to values of a process being monitored and program instructions for predicting an expected value at a current point of the process being monitored. Program instructions for calculating a difference between a measured value at the current point of the process being monitored and the corresponding expected value are provided. Program instructions for monitoring the difference to detect a deviation value between the measured value and the expected value and program instructions for identifying a transition point for the process being monitored based on the detection of the deviation value are included.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1:
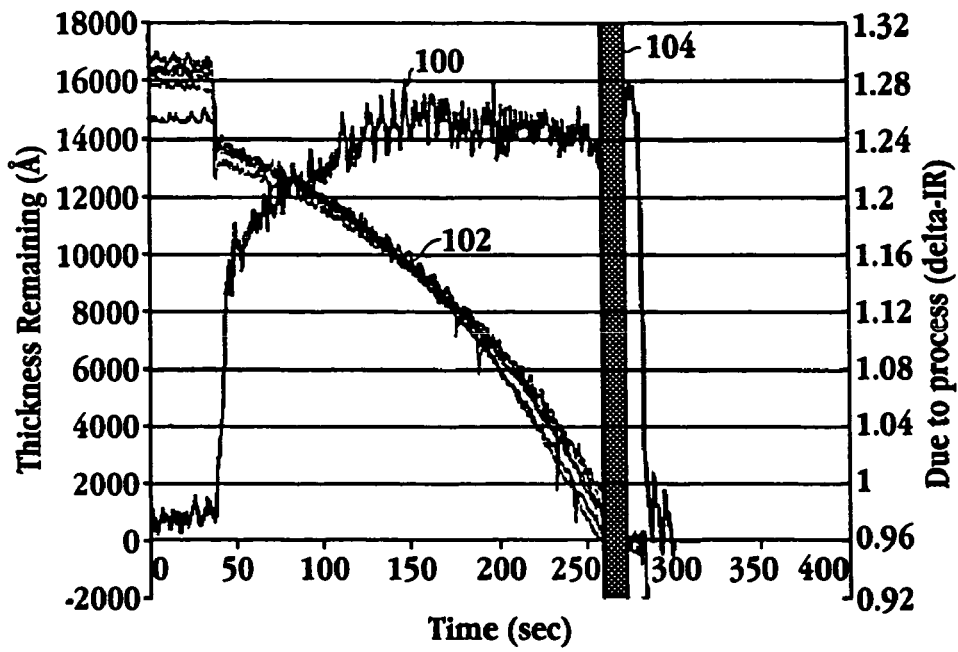
FIG. 1 is a graph of a thickness of a semiconductor wafer being monitored over time during a processing operation, such as a planarization processing operation.

An invention is described for a system, device and method that provides a reliable and stable measure of a transition point during a semiconductor processing operation. It will be obvious, however, to one skilled in the art, that the present invention may be practiced without some or all of these specific details. In other instances, well known process operations have not been described in detail in order not to unnecessarily obscure the present invention. FIG. 1 is described in the "Background of the Invention" section. The term about as used to herein refers to +/−10% of the referenced value.

The embodiments of the present invention provide a system and method for converting a slope detection task to a threshold detection task, as well as amplifying the transition features that are indicative of a transition. Threshold behavior, produces a step-like feature on the background of a zero or a constant signal and provides simpler detection algorithms, higher signal-to-noise ratios and more robust detectability. Threshold based determination for transition points/endpoints provides increased stability and reliability as compared to slope based determinations. In turn, more stable and reliable triggering conditions are provided with respect to a semiconductor operation. That is, since the transition point/endpoint is determined with a high degree of confidence, the downstream operations requiring substantially precise measurements may be initiated through in-line metrology. As a result, semiconductor throughput for the associated operations may be concomitantly increased. The complications resulting from small changes in slopes of the process tracing signal with respect to derivative analysis are eliminated by the conversion to a threshold type of tracing signal. It should be appreciated that the terms endpoint and transition point, as used herein, are interchangeable. It will be apparent to one skilled in the art that the terms endpoint and transition point may refer to any point in a semiconductor process, or any other process, where a targeted change is occurring, a targeted state is achieved, or where the attainment of a certain value associated with a monitored parameter is used to trigger an event, such as an endpoint or initiation of another process operation.

Figure 2:
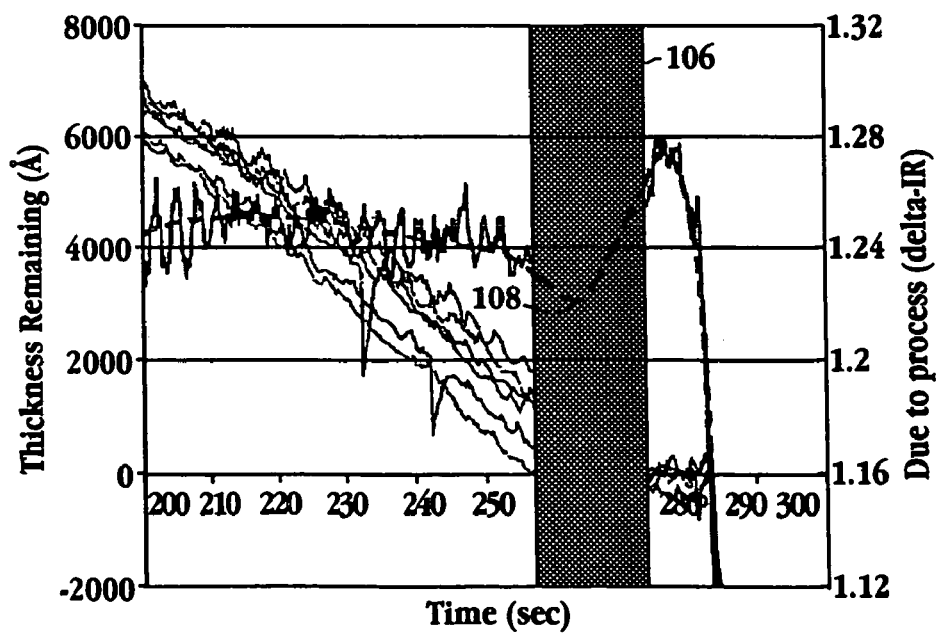
FIG. 2 is a graph of an infrared (IR) based trace where the noise level in the transition region is smoothed to show a transition point in accordance with one embodiment of the invention.

FIG. 2 is a graph of an infrared (IR) based trace where the noise level in the transition region is smoothed to show a transition point in accordance with one embodiment of the invention. Here, in region 106, the noise level is substantially eliminated to show trace 108 as a smoothed line. As can be seen, the slope associated with smoothed trace 108 transitions in region 106. However, the noise associated with the operation being monitored, e.g., a chemical mechanical planarization (CMP) operation or an etch operation, prevents real time stable and reproducible readings to trigger an event, such as an endpoint or initiation of another operation. It should be appreciated that while FIG. 2 illustrates an infrared signal related to temperature, other signals, e.g. eddy current sensors, vibration, optical refraction, etc., will exhibit similar properties. That is, the smoothed slope will indicate a transition point. However, as stated above, the background noise prevents a stable an accurate real time reading from the slope reading. As will be explained in more detail below, the conversion of the slope measurement to a threshold measurement removes the uncertainties associated with the noise levels that impact the small differences being analyzed for the derivative measurements associated with a slope measurement. Thus, a for more precise detection of a transition point in real time is enabled. The small changes in slope that indicate a transition point are masked by the noise in a slope measurement, however, the embodiments described herein substantially eliminate the noise from impacting the determination of the transition point.

Figure 3:
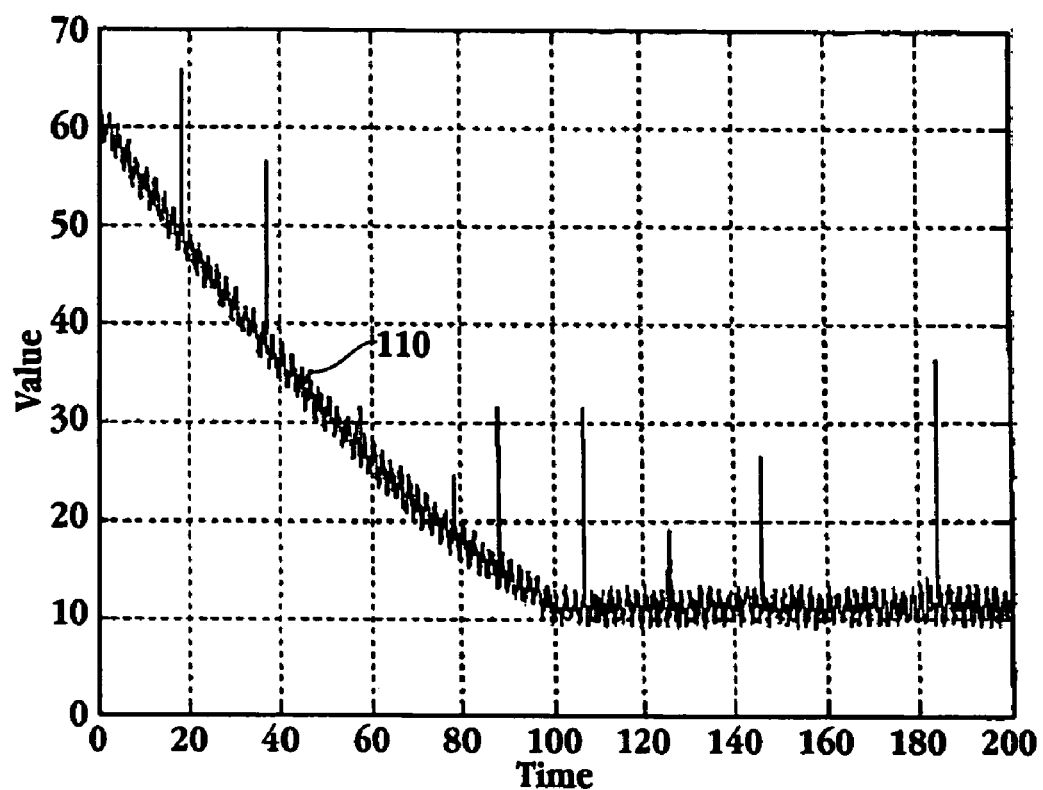
FIG. 3 is an exemplary graph of a signal trace over time where the period of time includes a transition point.

FIG. 3 is an exemplary graph of a signal trace over time, where the period of time includes a transition point. Here, signal 110 is plotted over time. In one embodiment, signal 110 originates from an eddy current sensor configured to detect a process parameter indicating a transition point during a semiconductor operation. It should be appreciated that other signals for detecting transition points during semiconductor operations can be included here, such as infrared, vibration, optical-based signals, etc. As can be seen, signal 110 has a significant amount of noise associated with the signal, however, a trend over time indicates a transition point at time 100. One skilled in the art will appreciate that a slope based determination would yield unstable results here, due to the background noise.

Figure 4:
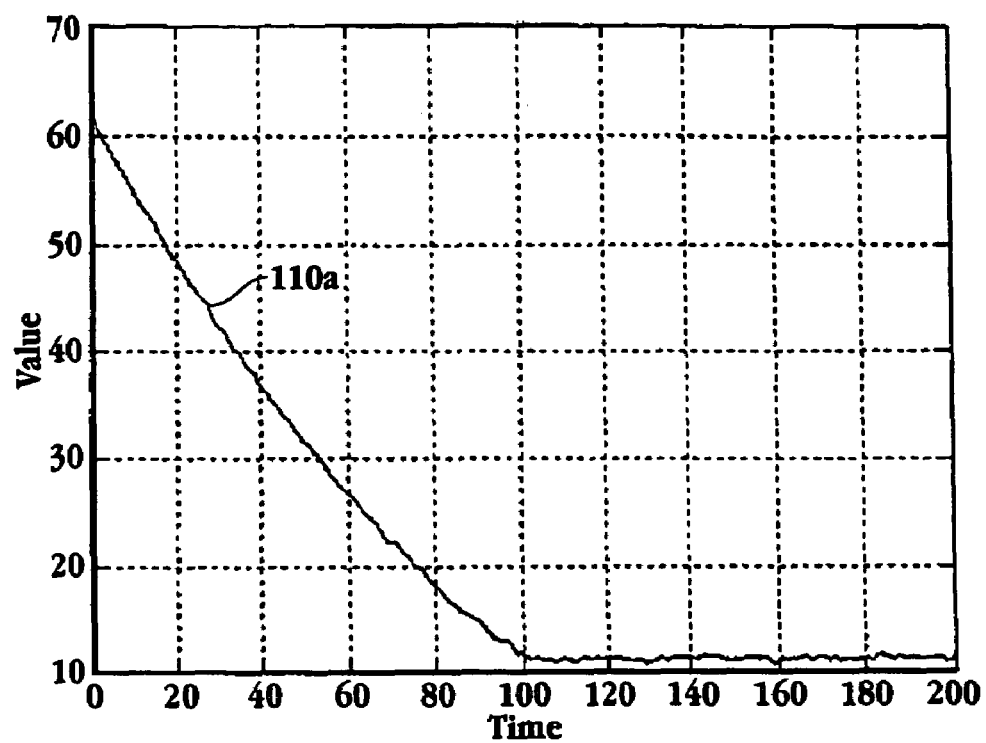
FIG. 4 is an exemplary graph of the signal of FIG. 3 which has been smoothed to eliminate noise.

FIG. 4 is an exemplary graph of the signal of FIG. 3 which has been smoothed to eliminate noise. Here, line 110a has had a regular sinusoidal noise filter applied in order to smooth the signal. Where signal 110a represents the values of an eddy current sensor over time, a transition point is shown by a change in slope at approximately time 100. As mentioned above, the smoothed slope is not able to be produced in a stable and precise manner in real time. Therefore, a slope based determination is not a viable alternative here.

Figure 5:
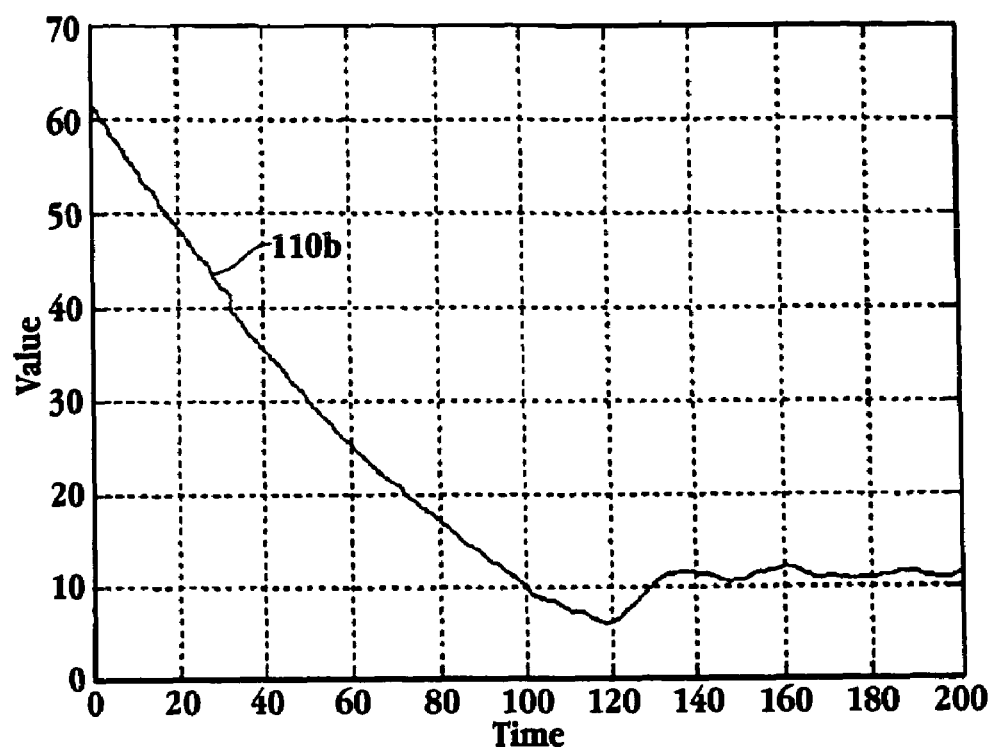
FIG. 5 is an exemplary graph of a predicted signal generated from the points of the actual signal of FIG. 3 in accordance with one embodiment of the invention.

FIG. 5 is an exemplary graph of a predicted signal generated from the points of the actual signal of FIG. 3 in accordance with one embodiment of the invention. Here, an approximation equation for a selected interval of data flow points is used to predict the most recent data reading in one embodiment of the invention. As will be explained in more detail with reference to FIGS. 8A and 8B, the predicted signal is generated by applying the approximation equation to historical data points of the actual signal to generate a predicted real-time data point in accordance with one embodiment of the invention. As shown in FIG. 5, the predicted signal represented by line 110b begins to deviate from the actual signal of FIGS. 3 and 4 at time 100, which represents a transition point. It should be appreciated that the approximation equation may be any polynomial equation. For example, the approximation equation may take the form of a linear equation, a parabolic equation or any other higher power equation.

Figure 6:
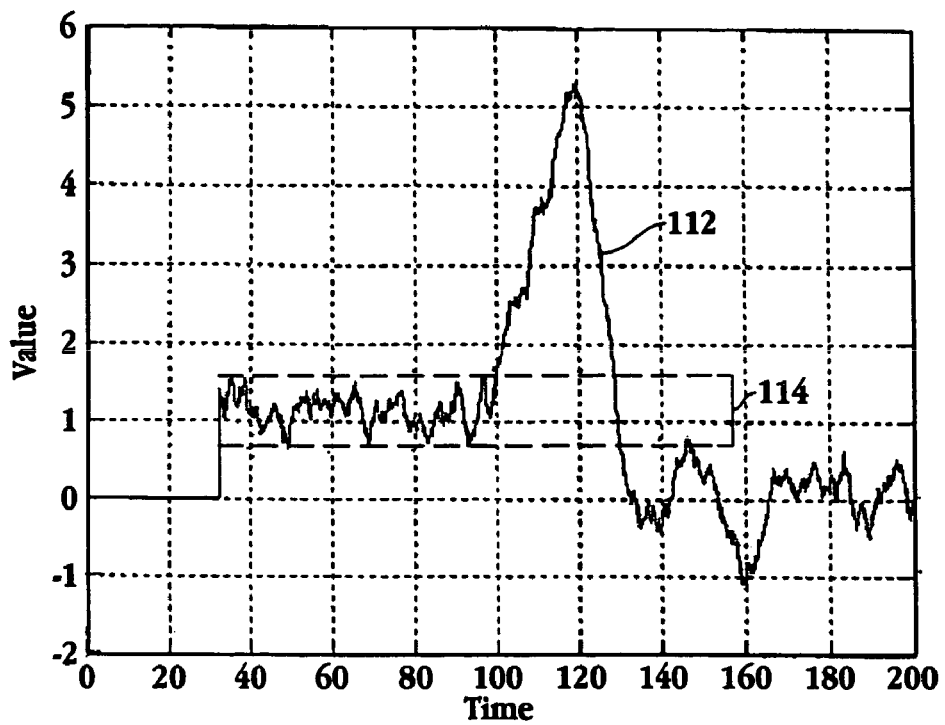
FIG. 6 is an exemplary graph of a deviation signal generated by calculating the difference between an actual signal and a corresponding predicted signal at various time points in accordance with one embodiment of the invention.

FIG. 6 is an exemplary graph of a deviation signal generated by calculating the difference between an actual signal and a corresponding predicted signal at various time points in accordance with one embodiment of the invention. Here, line 112 represents the difference between the predicted signal and the actual signal over time. Region 114 represents a corridor of noise. That is, an offset can be applied to the difference between the actual signal and the predicted signal to define a corridor of noise in which points outside of the corridor of noise would be considered valid points for a transition point. In essence, the corridor of noise defines a boundary around the difference between the actual value and the predicted value. In one embodiment, the offset is chosen as 3 times the value of the standard deviation, i.e., $3\sigma$. Thus, where the noise distribution is configured as a Gaussian distribution, then $3\sigma$ will cover 99.7% of all the points of the distribution. Therefore, out of 1000 points, a probability of $3\times10^{-3}$ exists for one point to be actually outside of the corridor of noise and to not be the start of a transition point. Depending on the nature of the process being monitored, this probability can be reduced or increased to provide an acceptable level of accuracy.

Figure 7:
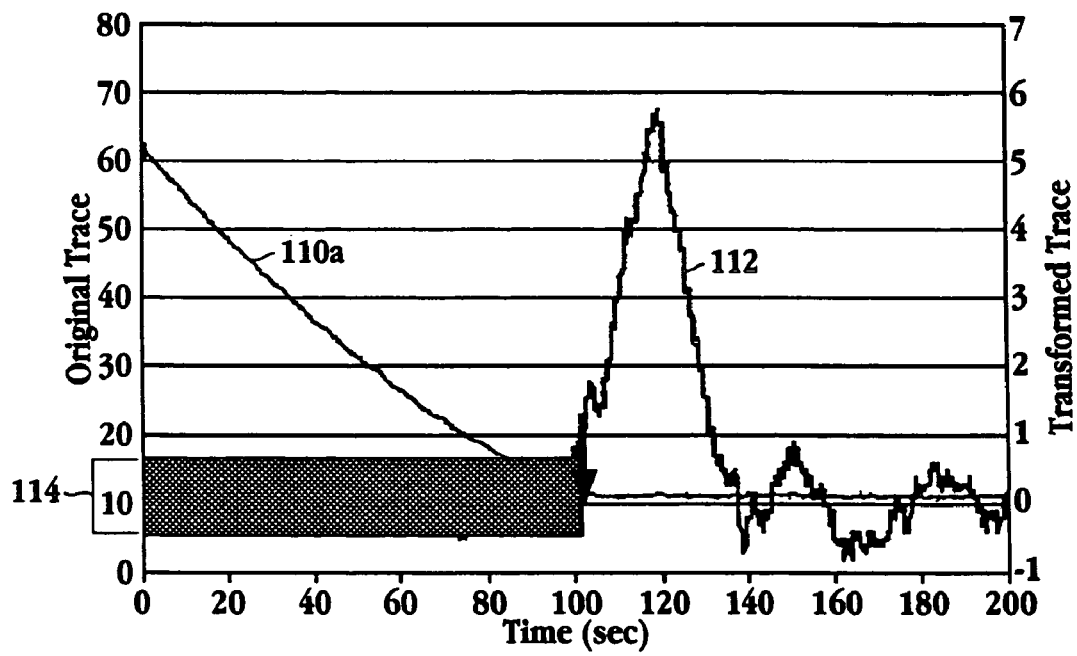
FIG. 7 is an exemplary graph including the graphs of FIGS. 4, 5 and 6 superimposed over each other to illustrate a threshold determination for the transition point in accordance with one embodiment of the invention.

FIG. 7 is an exemplary graph including the graphs of FIGS. 4, 5 and 6 superimposed over each other to illustrate a threshold determination for the transition point in accordance with one embodiment of the invention. Here, line 110a from FIG. 4 line 110b from FIG. 5 and line 112 are superimposed over each other. In addition, the corridor of noise 114 is also illustrated. It should be appreciated that line 112, which represents the deviation signal, i.e., the difference between the actual signal and the predicted signal, begins to exceed the corridor of noise at the transition point of time 100. As will be explained in further detail below, the $3\sigma$ corridor (of noise) can be adjusted in order to give a higher or lower confidence level that a transition point is being detected. For example, processing requiring high degrees of accuracy and precision may use a wider corridor of noise than processes requiring a less degree of accuracy and precision. In another embodiment, more than one consecutive point outside the boundaries of the corridor of noise may be required to trigger acknowledging a transition point.

Figure 8A:
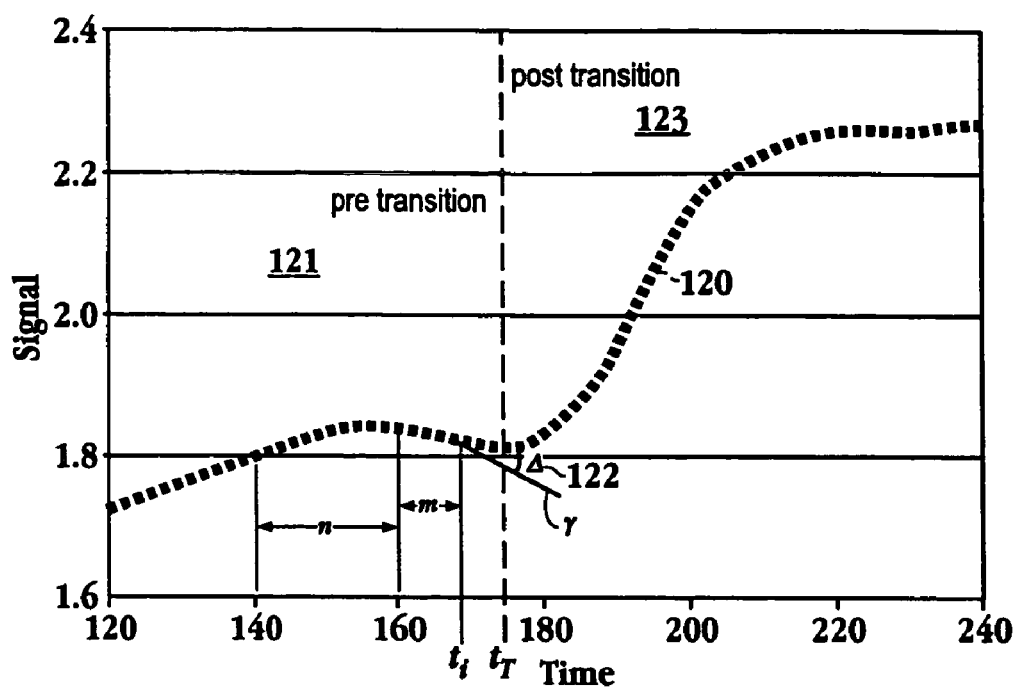
FIG. 8A is an exemplary graph illustrating a trace of an actual signal and a predicted signal in accordance with one embodiment of the invention.

FIG. 8A is an exemplary graph illustrating a trace of an actual signal and a predicted signal in accordance with one embodiment of the invention. Line 120 represents a plot of a process parameter reading over time. It should be appreciated that the process parameter a process parameter associated with a film thickness in one embodiment. Region 121 of the graph represents the pre-transition region, while region 123 of the graph represents the post transition region. Thus, line 120 represents two continuous processes, e.g., a pre-transition region process and a post-transition region process, and in between the two processes is an interrupt in the form of a transition point. The transition point here indicates a change from one state to another state. While the embodiments described herein refer to semiconductor processes, it should be appreciated that the methodology may be applied to any system where a transition is occurring and a slope detection process may capture the transition from one state to another state.

Still referring to FIG. 8A, a previous section or interval of data, for example section n of region 121, is used to predict the value at a later time point. In one embodiment, a polynomial equation, such as a parabolic equation is used to derive the predicted value corresponding to a most recent data reading. Here, a section of data, also referred to as a data interval, is taken and a data value projected forward by a distance m is calculated. One skilled in the art will appreciate that in one embodiment the parabolic (or higher power) approximation used to project the data value is of the form:

$$Y = a_1 t^n + a_2 t^{n-1} + \ldots + a_n$$ where Y represents the predicted value (y coordinate value) and t represents the time (x coordinate value).

Of course, it is assumed here that the previous data represents the dynamics of the respective region the data is associated with.

Thus, the actual signal measured by a detecting device, i.e., sensor, may be compared with the predicted signal which is calculated from an approximation equation. The actual signal and the predicted signal are substantially equal as long as no transition occurs and the projection (extrapolation) distance is not too large. That is, the difference between the value of the actual signal and the value of the predicted signal (represented as Si—Y where Si is the actual signal and Y is the predicted signal) is close to 0 within the noise level. However, once the transition occurs the difference between the actual signal and the predicted value starts to be increasingly greater than 0, Si—Y>0, as represented by $\Delta$ 122 of FIG. 8A. Accordingly, a threshold value may now be used to detect where the actual signal and the predicted value deviate. As will be explained further, the conversion of the slope detection process to a threshold detection process enhances (amplifies) the transition related changes so that the transition can be more accurately and precisely identified.

Figure 8B:
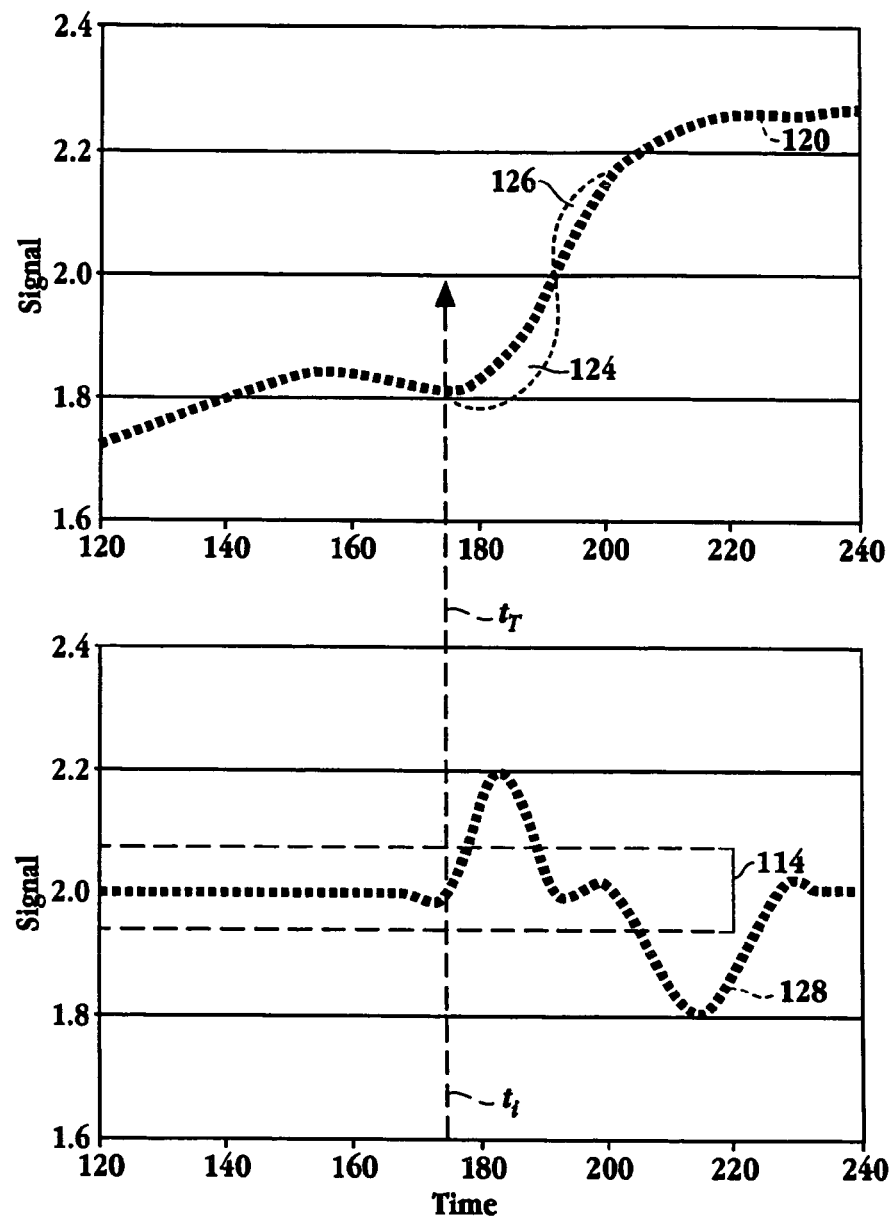
FIG. 8B is a graph of the original signal value and a corresponding graph of a deviation between the actual signal and a predicted signal in accordance with one embodiment of the invention.

FIG. 8B is a graph of the original signal value and a corresponding graph of a deviation between the actual signal and a predicted signal in accordance with one embodiment of the invention. The upper graph of FIG. 8B represents the actual signal of FIG. 8A. For example, with respect to semiconductor process monitoring, line 120 may represent a trace associated with a signal from an infrared sensor, an eddy current sensor, a vibration sensor, a temperature sensor, a sensor configured to detect reflected spectra, etc. A transition occurring at time $t_t$ is detected through deviation trace 128, also referred to as a delta trace. Regions 124 and 126 represent regions where the predicted value deviates from the actual signal as positive and negative differences, respectively, from the actual signal.

Delta trace 128 of FIG. 8B represents the difference between the actual signal and the predicted signal over time. Region 114 represents a corridor of noise. It should be appreciated that delta trace 128 and the trace 120 of the actual signal are likely to have background noise associated with each trace. Accordingly, trace 120 is likely to be similar to the trace of FIG. 3 and delta trace 128 is likely to be similar to the trace of FIG. 6. That is, the traces are likely to have noise associated with each trace rather than be smooth lines. Therefore, the corridor of noise is configured to take into account the noise level so that the noise level does not impact the determination of the transition point. At the same time, the magnitude, also referred to as the offset of the corridor of noise is chosen so that the transition occurs above the noise level, i.e., the corridor of noise is not so large as to mask the transition point.

In one embodiment, the offset of the corridor of noise is set at 3 standard deviations ($3\sigma$) of delta trace 128. Thus, where the noise is a Gaussian distribution, then $3\sigma$ will cover 99.7% of all the points of the distribution. As described above, a probability of $3 \times 10^{-3}$ exists for a point to fall outside of the corridor of noise and not be the start of a transition point, meaning that 3 out of each 1000 points could be actually outside of the defined $3\sigma$ interval. As will be explained further, with reference to FIG. 9, a number of consecutive points outside of the corridor of noise may be required to indicate the start of a transition point to further reduce the probability of a false positive. In one embodiment, the offset may not be necessary if a reasonably high number of consecutive points outside the corridor of noise is used or larger than $3\sigma$ noise corridor is used. It should be appreciated that any number of consecutive points outside the corridor of noise may be defined as the trigger for a transition point. The higher the number of consecutive points required to indicate that a transition point has been reached, the more confidence that the actual transition point has been obtained. Thus, for precise operations where it a false positive would be costly and cause irrecoverable damage, three or more consecutive points outside the corridor of noise may be chosen to provide a high degree of confidence. Where the operation is not as demanding it may desirable to choose less than three points.

Figure 8C:
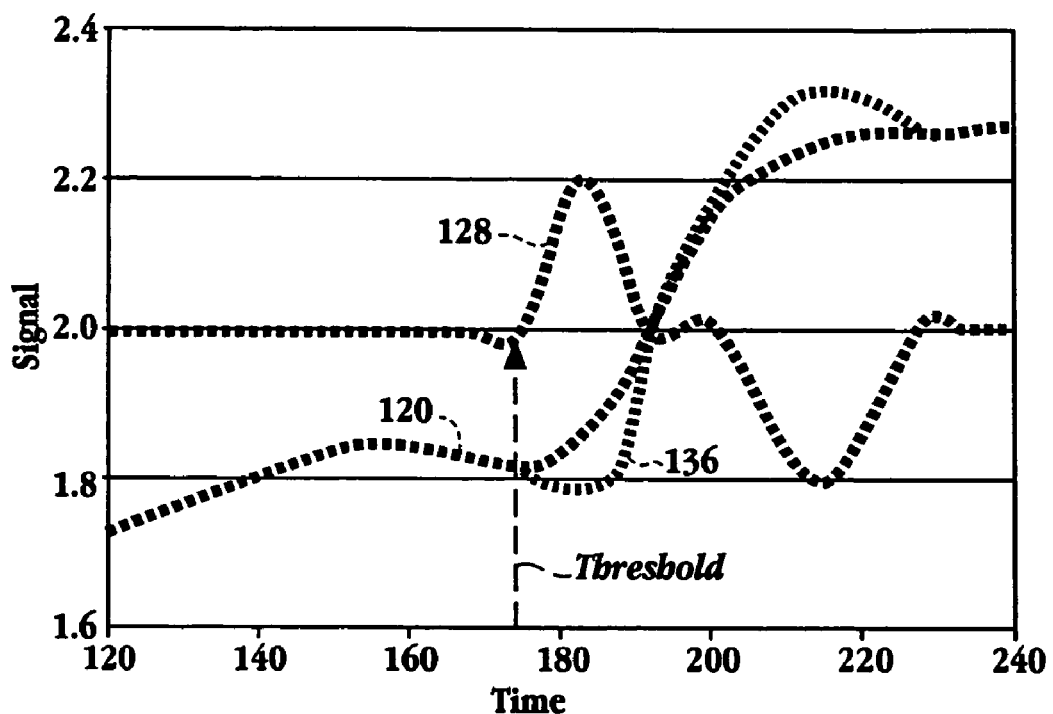
FIG. 8C is a graph illustrating the actual trace and the delta trace of FIGS. 8A and 8B superimposed with the predicted value trace, all of which are used for the conversion of a slope based task to a threshold based task in accordance with one embodiment of the invention.

FIG. 8C is a graph illustrating the actual trace and the delta trace of FIGS. 8A and 8B superimposed with the predicted value trace, all of which are used for the conversion of a slope based task to a threshold based task in accordance with one embodiment of the invention. Trace 120 represents the actual sensor reading. Trace 136 represents the parabolically extrapolated predicted value. Trace 128 represents the delta trace which is the difference between the actual sensor reading and the corresponding predicted value. The parabolically extrapolated predicted value includes a parabolic approximation associated with a selected interval of data points and a parabolic forecast to a most recent data reading. Delta trace 128 is calculated by subtracting the parabolically extrapolated predicted value for the current point and a number of foregoing consecutive points. Thus, a threshold may be defined when the delta trace is stably above the noise level. For example, defining a number of consecutive points outside the noise level prior to acknowledging that a transition point has occurred will provide a high confidence level that the transition point determination is accurate. One skilled in the art will appreciate that a transition point includes an endpoint as used herein. While a parabolic equation is used as the approximation equation in this embodiment, it should be appreciated that any polynomial equation may be used as the approximation equation as the shape of the curve defined by the actual sensor reading will impact the type of approximation equation.

Referring to FIG. 3 and FIG. 6, it can be seen that threshold determination of the delta trace approach of FIG. 6 is superior than the slope based approach of FIG. 3. That is, the noise in the slope based determination hides small changes in slope while the noise in the threshold based determination is eliminated as a concern by defining an offset or by requiring a number of consecutive points outside the corridor of noise prior to initiating the recognition of a transition point. Once a transition point has been achieved, it should be appreciated that another defined operation may initiate or an endpoint for a current process may occur. With respect to semiconductor manufacturing, e.g., etch, deposition, CMP operations or any other surface modification process, a first layer may have been added, removed, planarized or modified, and then the semiconductor wafer may be transitioned to another module in the processing tool or a different processing tool.

Figure 9:
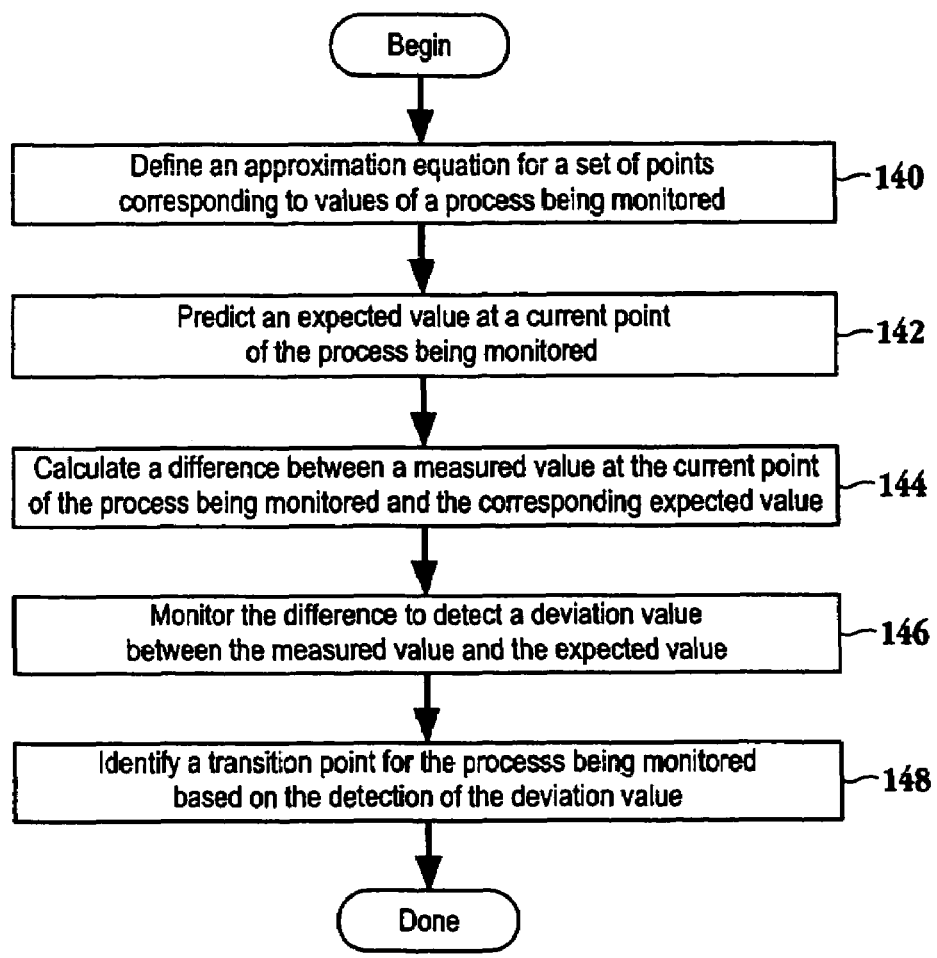
FIG. 9 is a flowchart of the method operations for a method for converting a slope based detection task to a threshold based detection task in accordance with one embodiment of the invention.

FIG. 9 is a flowchart of the method operations for a method for converting a slope based detection task to a threshold based detection task in accordance with one embodiment of the invention. The method initiates with operation 140 where an approximation equation is defined for a set of points. The approximation equation for a set of points corresponds to values of a process being monitored. For example, a polynomial equation, such as a parabolic equation, as discussed above, may be the approximation equation. The process being monitored may be monitored through eddy current sensors, infrared sensors, temperature sensors, vibration sensors, etc. The method then advances to operation 142 where an expected value at a current point of the process being monitored is predicted. Here, the polynomial equation takes a data interval of a number of consecutive points and predicts an expected value for the current point. In essence, the polynomial equation allows for forecasting the current point from past data points as described with reference to FIG. 8A.

The method of FIG. 9, then proceeds to operation 144 where a difference between the measured (actual) value at the current point of the process and the corresponding expected value is calculated. Here, the difference between the measured value and the expected (predicted) value will be approximately 0 until a transition point. It should be appreciated that the difference can be measured in terms of subtraction between two values, but is not limited to this interpretation of difference. The difference may be captured as a delta trace as described above with reference to FIGS. 8A–C. Thus, the difference between the measured value at the current point of the process and the corresponding expected value is monitored to detect a deviation value in operation 146. The deviation value may be defined as a number of consecutive points outside a corridor of noise, where the number of consecutive points may be one or more. In other embodiments, the difference may also be calculated as a ratio, a square of differences, etc. That is, the term difference as used herein refers to a broad range of measures that indicate a generalized difference between two values. Alternatively, an offset may be used, where the offset is high enough to avoid background noise from indicating a transition point and low enough so that the deviation value indicating the transition point may be identified, i.e., is not masked by the offset. The method then advances to operation 148 where a transition point for the process being monitored is identified based on the detection of the deviation value. Of course, the transition point may end the current process operation and trigger another process operation or simply end the current process.

Figure 10:
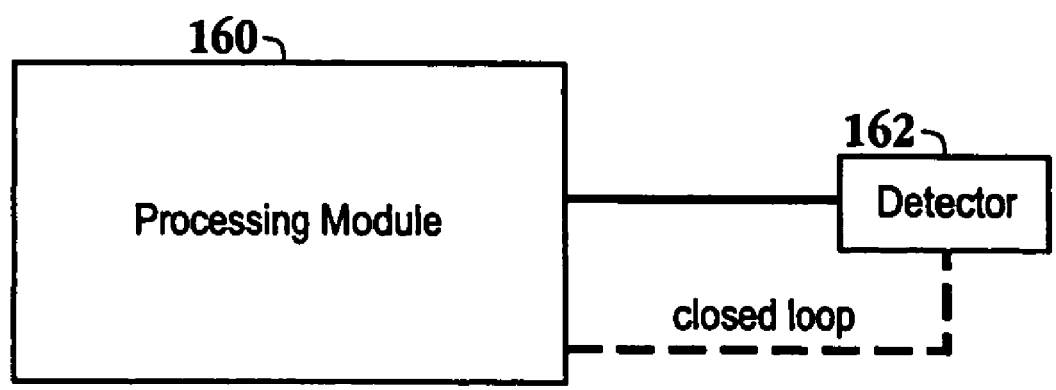
FIG. 10 is a high-level schematic diagram of a processing module in communication with a detector configured to convert a slope detection transition point to a threshold detection transition point in accordance with one embodiment of the invention.

FIG. 10 is a high-level schematic diagram of a processing module in communication with a detector configured to convert a slope detection transition point to a threshold detection transition point in accordance with one embodiment of the invention. Processing module 160 may be any processing module, e.g., any associated semiconductor processing module such as a CMP module, etch module, etc. Detector 162 is in communication with processing module 160. For example, sensors located within processing module 160 may be used to transmit signals to detector 162. Detector 162 is configured to convert a process in which slope determines a transition point to a threshold detection process where a threshold value is used to detect a transition point. That is, the embodiments described with reference to FIGS. 8A, 8B, 8C and 9 convert the slope detection process into a threshold detection process are performed by detector 162. Furthermore, the changes occurring in the transition point are enhanced so that the threshold value can be readily detected. In one embodiment, the threshold value is defined as a difference between an actual signal and a predicted signal as described herein. It should be appreciated that detector 162 may be a general purpose computer controlling the processing operation being performed in processing module 160. Detector 162 may receive signals from sensors configured to monitor a composition change or a state change as described below. Of course, the communication between processing module 160 and detector 162 may be through a closed loop.

Figure 11:
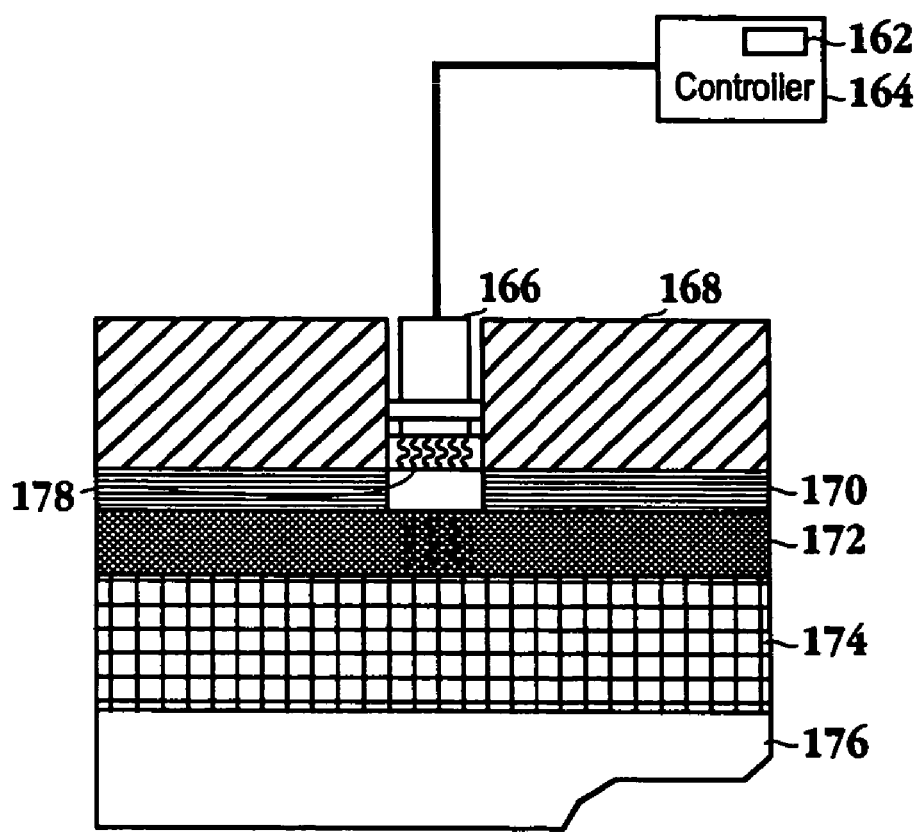
FIG. 11 is a simplified schematic diagram of a CMP system having an infrared sensor to determine a transition point of a semiconductor substrate being processed in accordance with one embodiment of the invention.

FIG. 11 is a simplified schematic diagram of a CMP system having an infrared sensor to determine a transition point of a semiconductor substrate being processed in accordance with one embodiment of the invention. Controller 164 includes detector 162. Controller 164 is in communication with infrared sensor 166. Infrared sensor is contained within carrier plate 168. Semiconductor substrate 172 is supported against carrier film 170 within carrier plate 168. Infrared sensor 166 has a line of view through window 178 to semiconductor substrate 172. Polishing pad 174 planarizes a surface of semiconductor substrate 172. Polishing pad 174 is disposed over stainless steel belt 176. Detector 162 converts the slope based signal process associated with the infrared sensor to a threshold based signal. In one embodiment, the slope based signal is converted to a threshold based operation by defining a delta trace between an actual signal and a predicted signal as described with reference to FIGS. 8A–C and 9.

Figure 12:
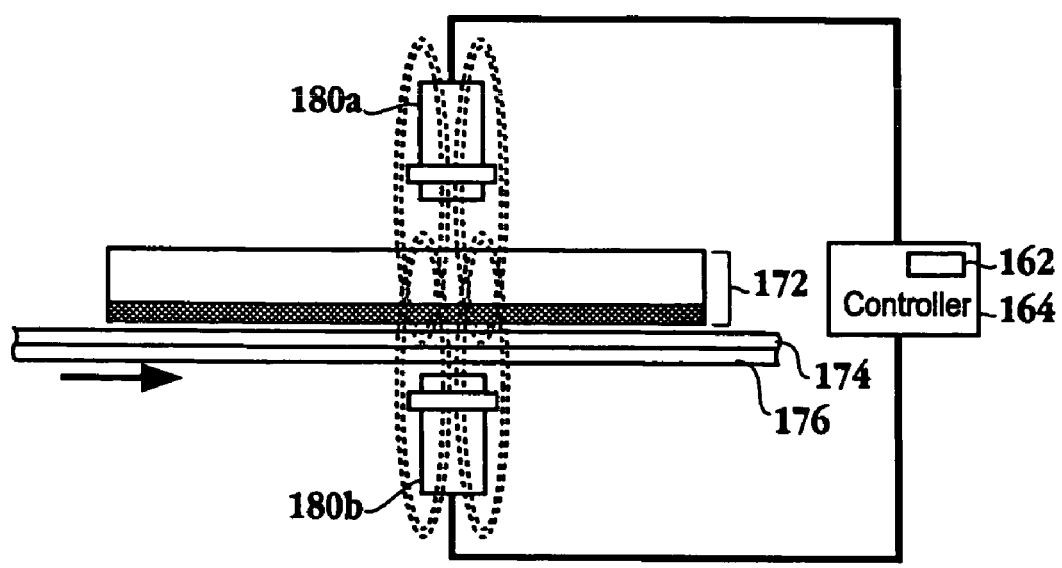
FIG. 12 is a simplified schematic diagram of a processing system having eddy current sensors configured to determine a transition point of a semiconductor substrate being processed in accordance with one embodiment of the invention.

FIG. 12 is a simplified schematic diagram of a processing system having eddy current sensors configured to determine a transition point of a semiconductor substrate being processed in accordance with one embodiment of the invention. Controller 164 includes detector 162. Controller 164 is in communication with eddy current sensors 180*a* and 180*b*. Eddy current sensors 180*a* and 180*b* may be configured to monitor a process parameter such as thickness of a film disposed over semiconductor substrate 162. Where the processing system is a CMP processing system, polishing pad 174 planarizes a surface of semiconductor substrate 172. Polishing pad 174 is disposed over backing 176. Detector 162 converts the slope based detection output of eddy current sensors 180*a* and 180*b* to a threshold detection process. Here again, detector 162 tracks a difference between measured values and predicted values in order to detect a threshold deviation value that indicates a transition point.

FIGS. 11 and 12 depict specific embodiments of sensors used for semiconductor fabrication. It should be appreciated that the embodiments described herein may be associated with any type of sensor that is capable of monitoring a composition change or a state change. Exemplary composition changes include surface composition changes where a first layer is removed and a second layer is exposed or a surface of an object, such as a semiconductor wafer, is modified. Exemplary state changes include the change from a liquid to a gas, liquid to a solid, etc. In fact, a transition point may be defined as a point at which a composition or a state change occurs. At the transition point, a property, which is monitored through the sensors described herein, changes due to the processing conditions. Targeted properties include properties such as thickness, resistance, planarity, transparency, vibration, chemical composition, etc. This change is monitored and the transition point is determined by a threshold detection scheme as described herein. One skilled in the art will appreciate that the embodiments described herein are not limited to the specific types of sensors described above. More particularly, any sensor configured to detect a signal indicating a composition or a state change may be used with the embodiments described above, whether or not the sensors are associated with a semiconductor fabrication process. It should be further appreciated that the sensors can detect the change through the object being processed, e.g., semiconductor wafer, or a component of the processing module, e.g., polishing pad. Thus, the transition point may be detected directly or indirectly. Some exemplary sensors include sensors configured to detect resistance, capacitance, reflected light, vibration, etc.

In summary, the above described invention describes a method and a system for converting a slope based detection task to a threshold based detection task. An approximation equation, such as a polynomial equation, is used to predict an expected value at the current data point. A difference between the expected value and the corresponding actual value supplied from a sensor is monitored to detect a transition point. The monitored difference may be captured as a delta trace as described herein. The tracking of the difference allows a threshold value to be defined. In one embodiment, the transition point occurs when a pre-defined number of consecutive points of the monitored difference are detected outside of a corridor of noise. An offset may also be provided to define a level where a detected point, i.e., value of a difference between an actual value and a predicted value, outside of the offset boundary indicates a transition point. By converting the slope detection task to a threshold detection task, a stable and reliable transition detection system is provided that avoids the need to analyze derivatives as required by the slope detection tasks. Additionally, the delta trace described above enhances the changes occurring at the transition point in order to more readily identify the transition point.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The above described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

The invention can also be embodied as computer readable code on a computer readable medium. The computer readable medium is any data storage device that can store data which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for converting a slope based detection task to a threshold based detection task, comprising:

defining a slope based approximation equation for a set of points corresponding to values of a process being monitored;

monitoring a difference between a measured value at a current point of the process being monitored and a corresponding expected value to detect a threshold deviation value between the measured value and the expected value, the corresponding expected value being determined through the slope based approximation equation; and identifying an endpoint for the process being monitored based on the detection of the threshold deviation value.

2. The method of claim 1, wherein the method operation of monitoring a difference between a measured value at a current point of the process being monitored and a corresponding expected value to detect a threshold deviation value between the measured value and the expected value includes, predicting an expected value at the current point of the process being monitored through the slope based approximation equation.

3. The method of claim 2 further comprising:

tracing the difference between the measured value and the corresponding expected value; and defining a corridor of noise, the corridor of noise providing a boundary, wherein which the deviation value falls outside of the boundary.

4. The method of claim 1, further comprising:

identifying an endpoint for the process being monitored based on the detection of the threshold deviation value; and identifying more than one consecutive points in which the corresponding threshold deviation value is outside a corridor of noise.

5. The method of claim 4, further comprising:

in response to identifying the endpoint, triggering an end of the processing being monitored.

6. The method of claim 1, wherein the approximation equation is a polynomial equation.

7. The method of claim 1, wherein the measured value is generated by a sensor configured to detect a property associated with process being monitored.

8. The method of claim 1, wherein the approximation equations derives the expected value from an interval of past data generated by a sensor associated with the process being monitored.

9. A semiconductor processing system capable of detecting a transition point for slope change transitions through a threshold determination in real time, comprising:

a sensor configured to monitor a process parameter associated with a process operation; and a detector in communication with the sensor, the detector configured to compare measured values to predicted values, the measured values indicating a transition point through a slope change, the predicted values being derived from previously measured values, the detector further configured to track a difference between the measured values and the corresponding predicted values to enhance a change at the transition point.

10. The system of claim 9, wherein enhancing the change at the transition point enables a threshold deviation value to be defined, the threshold deviation value indicative of the transition point.

11. The system of claim 10, wherein the detector is configured to initiate a transition associated with the processing system when a difference between the measured values and the predicted values for at least two consecutive time points exceeds the threshold deviation value.

12. The system of claim 10, wherein the threshold deviation value occurs at a time point corresponding to a slope transition associated with a trace of the measured values.

13. The system of claim 9, wherein the sensor is sensitive to variation of the process parameter, the process parameter varying as one of a composition and a state changes, the composition and the state changes associated with one of a semiconductor wafer and a component of the processing module.

14. The system of claim 9, wherein the sensor is selected from the group consisting of an eddy current sensor, an infrared sensor, a vibration sensor and a sensor configured to detect reflected spectra.

15. The system of claim 9, wherein the detector is configured to associate an offset for substantially eliminating background noise interference.

16. A method for detecting a transition point of a slope based change through a threshold detection, comprising
calculating a predicted value of a monitored parameter from past values of the monitored parameter through a slope based approximation, the predicted value corresponding to a current value of the parameter being monitored;
tracking a difference between the current value and the predicted value for successive time points; and
identifying a transition point when the difference exceeds a threshold value.

17. The method of claim 16, wherein the threshold value is outside an offset, the offset configured to substantially eliminate background noise from interfering with identification of the transition point.

18. The method of claim 16, wherein the method operation of identifying a transition point when the difference exceeds a threshold value includes,
identifying at least two points when the difference exceeds the threshold value.

19. The method of claim 16 further comprising:
tracing the difference between the current value and the corresponding predicted value; and
defining a corridor of noise, the corridor of noise providing a boundary, wherein which the threshold value falls outside of the boundary.

20. The method of claim 16, wherein the parameter is capable of being monitored by a sensor configured to detect a composition change or a state change associated with an object being processed.

21. A computer readable media having program instructions for converting a slope based detection task to a threshold based detection task, comprising:
program instructions for defining a slope based approximation equation for a set of points corresponding to values of a process being monitored;
program instructions for monitoring a difference between a measured value at a current point of the process being monitored and a corresponding expected value to detect a threshold deviation value between the measured value and the expected value, the corresponding expected value being determined through the slope based approximation equation; and
program instructions for identifying an endpoint for the process being monitored based on the detection of the threshold deviation value.

22. The computer readable media of claim 21, wherein the program instructions for monitoring a difference between a measured value at a current point of the process being monitored and a corresponding expected value to detect a threshold deviation value between the measured value and the expected value includes,
program instructions for predicting an expected value at the current point of the process being monitored through the slope based approximation equation.

23. The computer readable media of claim 21, further comprising:
program instructions for identifying an endpoint for the process being monitored based on the detection of the threshold deviation value; and
program instructions for identifying more than one consecutive points in which the corresponding threshold deviation value is outside a corridor of noise.

* * * * *